(12) United States Patent
Haeberlen et al.

(10) Patent No.: US 10,418,319 B2
(45) Date of Patent: Sep. 17, 2019

(54) METHOD OF MANUFACTURING A SEMICONDUCTOR DEVICE

(71) Applicant: Infineon Technologies AG, Neubiberg (DE)

(72) Inventors: Oliver Haeberlen, Villach (AT); Klaus Schiess, Allensbach (DE); Stefan Kramp, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/893,937

(22) Filed: May 14, 2013

(65) Prior Publication Data

US 2013/0252382 A1     Sep. 26, 2013

Related U.S. Application Data

(62) Division of application No. 12/179,912, filed on Jul. 25, 2008, now Pat. No. 8,441,804.

(51) Int. Cl.
*H01L 23/495*     (2006.01)
*H01L 23/31*     (2006.01)
(Continued)

(52) U.S. Cl.
CPC ...... *H01L 23/49861* (2013.01); *H01L 21/561* (2013.01); *H01L 23/142* (2013.01); *H01L 23/315* (2013.01); *H01L 23/3121* (2013.01); *H01L 23/3157* (2013.01); *H01L 23/3171* (2013.01); *H01L 23/3185* (2013.01); *H01L 23/36* (2013.01); *H01L 23/492* (2013.01); *H01L 23/49541* (2013.01); *H01L 23/49548* (2013.01); *H01L 23/49575* (2013.01); *H01L 24/11* (2013.01); *H01L 24/12* (2013.01); *H01L 24/16* (2013.01); *H01L 24/19* (2013.01); (Continued)

(58) Field of Classification Search
CPC ......... H01L 23/49861; H01L 23/49541; H01L 23/49548; H01L 23/49575; H01L 23/315; H01L 23/3171; H01L 23/3185; H01L 23/28; H01L 23/31; H01L 23/3157
USPC .......................... 257/676; 438/112, 123, 637
See application file for complete search history.

(56) References Cited

U.S. PATENT DOCUMENTS 5,841,197 A * 11/1998 Adamic, Jr. .................. 257/777
5,973,393 A * 10/1999 Chia et al. .................... 257/690
(Continued)

OTHER PUBLICATIONS

Office Action dated Jul. 13, 2011 in U.S. Appl. No. 12/179,912.
Office Action dated Dec. 28, 2011 in U.S. Appl. No. 12/179,912.
Office Action dated Jun. 6, 2012 in U.S. Appl. No. 12/179,912.

*Primary Examiner* — Zandra V Smith
*Assistant Examiner* — Abbigale A Boyle
(74) *Attorney, Agent, or Firm* — Dicke, Billig & Czaja, PLLC (57) ABSTRACT

A method of manufacturing a semiconductor device includes providing an electrically conductive carrier and placing a semiconductor chip over the carrier. The method includes applying an electrically insulating layer over the carrier and the semiconductor chip. The electrically insulating layer has a first face facing the carrier and a second face opposite to the first face. The method includes selectively removing the electrically insulating layer and applying solder material where the electrically insulating layer is removed and on the second face of the electrically insulating layer.

20 Claims, 7 Drawing Sheets

(51) Int. Cl.
   *H01L 23/498* (2006.01)
   *H01L 21/56* (2006.01)
   *H01L 23/14* (2006.01)
   *H01L 23/36* (2006.01)
   *H01L 23/492* (2006.01)
   *H01L 23/00* (2006.01)

(52) U.S. Cl.
   CPC .............. *H01L 24/20* (2013.01); *H01L 24/82* (2013.01); *H01L 24/97* (2013.01); *H01L 2224/05001* (2013.01); *H01L 2224/05026* (2013.01); *H01L 2224/05572* (2013.01); *H01L 2224/05639* (2013.01); *H01L 2224/05655* (2013.01); *H01L 2224/05666* (2013.01); *H01L 2224/13099* (2013.01); *H01L 2224/24226* (2013.01); *H01L 2224/32245* (2013.01); *H01L 2224/73267* (2013.01); *H01L 2224/76155* (2013.01); *H01L 2224/82039* (2013.01); *H01L 2224/82047* (2013.01); *H01L 2224/92244* (2013.01); *H01L 2224/97* (2013.01); *H01L 2924/00014* (2013.01); *H01L 2924/014* (2013.01); *H01L 2924/01006* (2013.01); *H01L 2924/01013* (2013.01); *H01L 2924/01015* (2013.01); *H01L 2924/01022* (2013.01); *H01L 2924/01023* (2013.01); *H01L 2924/01024* (2013.01); *H01L 2924/01027* (2013.01); *H01L 2924/01029* (2013.01); *H01L 2924/01032* (2013.01); *H01L 2924/01033* (2013.01); *H01L 2924/01046* (2013.01); *H01L 2924/01047* (2013.01); *H01L 2924/01078* (2013.01); *H01L 2924/01079* (2013.01); *H01L 2924/01082* (2013.01); *H01L 2924/01327* (2013.01); *H01L 2924/10329* (2013.01); *H01L 2924/12042* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/14* (2013.01)

(56) References Cited

U.S. PATENT DOCUMENTS

| | | | |
|---|---|---|---|
| 6,624,522 B2 | 9/2003 | Standing et al. | |
| 6,639,324 B1* | 10/2003 | Chien | 257/778 |
| 6,677,669 B2* | 1/2004 | Standing | 257/685 |
| 6,774,499 B1 | 8/2004 | Vang | |
| 6,835,580 B1* | 12/2004 | Knapp et al. | 438/15 |
| 6,890,845 B2 | 5/2005 | Standing et al. | |
| 7,185,426 B1* | 3/2007 | Hiner et al. | 29/841 |
| 7,294,922 B2 | 11/2007 | Jobetto et al. | |
| 7,572,681 B1* | 8/2009 | Huemoeller et al. | 438/125 |
| 7,727,813 B2* | 6/2010 | Otremba | H01L 21/568 |
| | | | 438/118 |
| 7,777,351 B1* | 8/2010 | Berry | H01L 23/3128 |
| | | | 257/778 |
| 2003/0087538 A1* | 5/2003 | Ueno | 439/68 |
| 2003/0133274 A1* | 7/2003 | Chen et al. | 361/760 |
| 2003/0134455 A1* | 7/2003 | Cheng et al. | 438/125 |
| 2004/0048413 A1* | 3/2004 | Quah | 438/106 |
| 2004/0113261 A1 | 6/2004 | Sunohara et al. | |
| 2004/0140573 A1* | 7/2004 | Pu et al. | 257/782 |
| 2004/0178495 A1* | 9/2004 | Yean et al. | 257/723 |
| 2005/0042854 A1 | 2/2005 | Huang | |
| 2005/0130349 A1 | 6/2005 | Sunohara | |
| 2006/0237827 A1* | 10/2006 | Wu et al. | 257/676 |
| 2007/0108585 A1* | 5/2007 | Pavier et al. | 257/690 |
| 2007/0296065 A1* | 12/2007 | Yew | H01L 23/5389 |
| | | | 257/659 |
| 2009/0042337 A1 | 2/2009 | Landau et al. | |
| 2009/0127573 A1* | 5/2009 | Guenther et al. | 257/98 |
| 2009/0160046 A1 | 6/2009 | Otremba et al. | |

* cited by examiner

METHOD OF MANUFACTURING A SEMICONDUCTOR DEVICE

CROSS-REFERENCE TO RELATED APPLICATIONS

This Utility Patent Application is a divisional of U.S. patent application Ser. No. 12/179,912, filed Jul. 25, 2008, which is incorporated herein by reference.

BACKGROUND

This invention relates to a semiconductor device and a method of manufacturing a semiconductor device.

Power semiconductor chips may, for example, be integrated into semiconductor devices. Power semiconductor chips are suitable, for example, for the switching or control of currents and/or voltages. Power semiconductor chips may, for example, be implemented as power MOSFETs, IGBTs, JFETs, power bipolar transistors or power diodes.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types and may include, for example, integrated electrical or electro-optical circuits. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in one embodiment on its two main surfaces, that is to say on its top side and bottom side. In one embodiment, power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example, the integrated circuits of power semiconductor chips. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

The semiconductor chips have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main surfaces of the semiconductor chips or on other surfaces of the semiconductor chips.

The semiconductor chips may be placed on carriers. The carriers may be of any shape, size and material. During the fabrication of the devices the carriers may be connected to each other. The carriers may also be made from one piece. The carriers may be connected among each other by connection means with the purpose of separating some of the carriers in the course of the fabrication. Separation of the carriers may be carried out by mechanical sawing, a laser beam, cutting, stamping, milling, etching or any other appropriate method. The carriers may be electrically conductive. They may be fabricated from metals or metal alloys, in one embodiment copper, copper alloys, iron nickel, aluminum, aluminum alloys, steel, stainless steel or other appropriate materials. The carriers may be, for example, a leadframe or a part of a leadframe. Furthermore, the carriers may be plated with an electrically conductive material, for example, copper, silver, iron nickel or nickel phosphorus.

The devices may include one or more electrically insulating layers. The electrically insulating layers may cover any fraction of any number of surfaces of the components of the device, such as the carrier and the semiconductor chip integrated in the device. The electrically insulating layers may serve various functions. They may be used, for example, to electrically insulate components of the device from each other and/or from external components, but they may also be used as platforms to mount other components, for example, wiring layers or contact elements. The electrically insulating layers may be fabricated using various techniques, for example, using stencil printing, screen printing or any other appropriate printing technique. Furthermore, the electrically insulating layers may be deposited from a gas phase or a solution or may be laminated as foils. The electrically insulating layers may, for example, be made from organic materials, such as imide, epoxy or other thermosetting materials, photoresist, silicon nitride, metal oxides, semiconductor oxides, ceramics or diamond-like carbon.

The carrier may contain one or more metal layers. The metal layers may be used as wiring layers to make electrical contact with the semiconductor chips from outside the devices or to make electrical contact with other semiconductor chips and/or components contained in the devices. Furthermore, the metal layers may be used as diffusion barriers and/or adhesion layers for solder material which may be deposited on the metal layers. The metal layers may be manufactured with any desired geometric shape and any desired material composition. The metal layers may, for example, be composed of conductor tracks, but may also be in the form of a layer covering an area. Any desired metals or metal alloys, for example, titanium, nickel, silver, aluminum, palladium, tin, gold or copper, may be used as the material. Moreover, several metal layers may be stacked on top of each other.

Through-holes may be formed in the electrically insulating layer, for example, by etching, photostructuring, laser ablation or mechanical drilling. The through-holes may be filled with one or more electrically conductive materials, for example, a solder material, such as AgSn, AuSn, CuSn, Sn, AgIn or CuIn. By filling the through-holes with the electrically conductive materials through-connections are obtained in the electrically insulating layer. The through-connections may extend from a first face of the electrically insulating layer to a second face of the electrically insulating layer, which is opposite and parallel to the first face. The through-connections are electrically conductive and may electrically couple an electrically conductive layer on the first face to an electrically conductive layer on the second face of the electrically insulating layer. The through-connections may, for example, be vias (vertical interconnect access).

The devices described below may include external contact elements, which may be of any shape and size. The external contact elements may be accessible from outside the device and may thus allow electrical contact to be made with the semiconductor chips from outside the device. Furthermore, the external contact elements may be thermally conducting and may serve as heat sinks for dissipating the heat generated by the semiconductor chips. The external contact elements may be composed of any desired electrically conductive material, for example, solder material.

Figure 1:
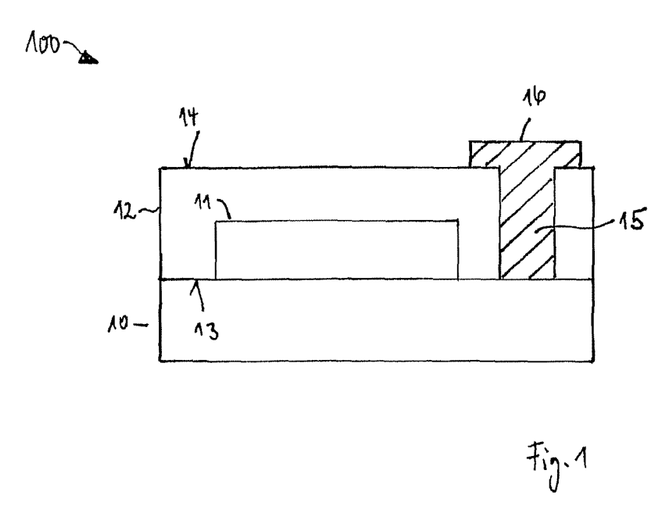
FIG. 1 schematically illustrates one embodiment of a device.

FIG. 1 schematically illustrates one embodiment of a device 100 in cross section. The device 100 includes an electrically conductive carrier 10, over which a semiconductor chip 11 is placed. An electrically insulating layer 12 is applied over the carrier 10 and the semiconductor chip 11.

The electrically insulating layer 12 has a first face 13 facing the carrier 10 and a second face 14 opposite to the first face 13. At least one first through-hole 15 is formed in the electrically insulating layer 12. Solder material 16 is deposited in the first through-hole 15 and on the second face 14 of the electrically insulating layer 12.

Figure 2A:
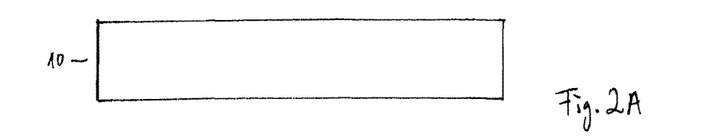
FIGS. 2A to 2E schematically illustrate one embodiment of a method to fabricate a device.
Figure 2B:
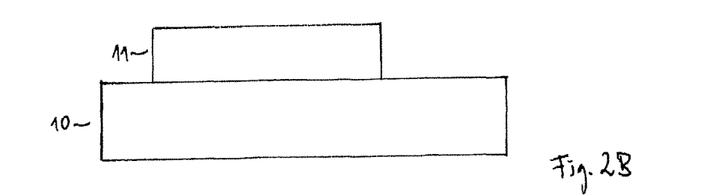
Figure 2C:
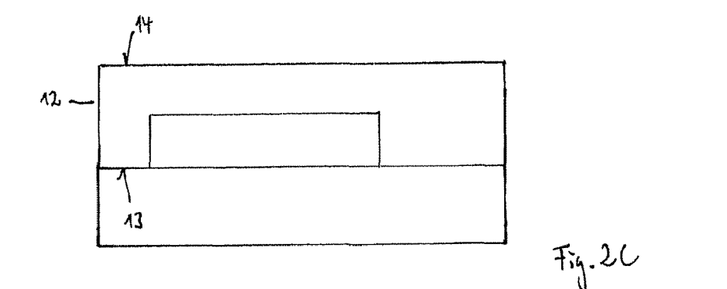
Figure 2D:
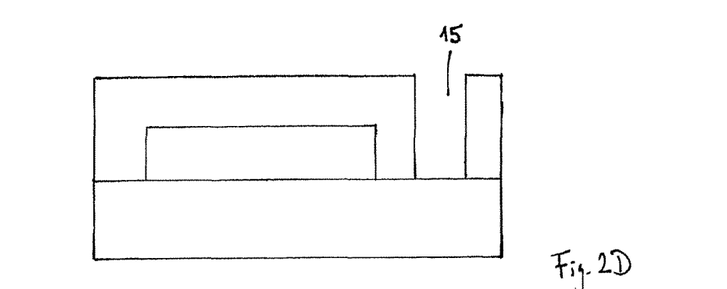
Figure 2E:
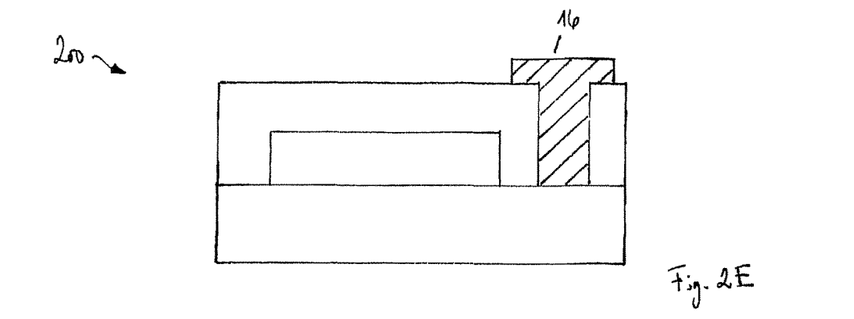

FIGS. 2A to 2E schematically illustrate a method for production of a device 200. A cross section of the device 200 obtained by the method is illustrated in FIG. 2E. An electrically conductive carrier 10 is provided (see FIG. 2A). A semiconductor chip 11 is placed over the carrier 10 (see FIG. 2B). An electrically insulating layer 12 is applied over the carrier 10 and the semiconductor chip 11 (see FIG. 2C). The electrically insulating layer 12 has a first face 13 facing the carrier 10 and a second face 14 opposite to the first face 13. The electrically insulating layer 12 is then selectively removed (see FIG. 2D). Solder material 16 is applied to places 15 where the electrically insulating layer 12 has been removed and on the second face 14 of the electrically insulating layer 12 (see FIG. 2E).

Figure 3A:
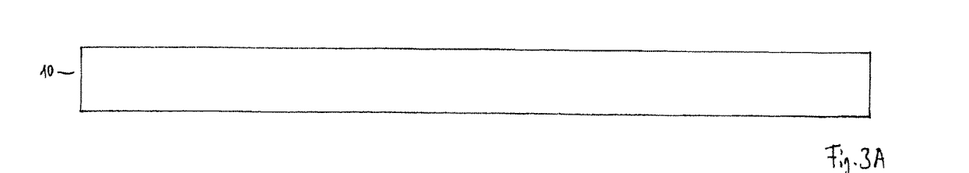
FIGS. 3A to 3K schematically illustrate one embodiment of a method to fabricate a device.
Figure 3B:
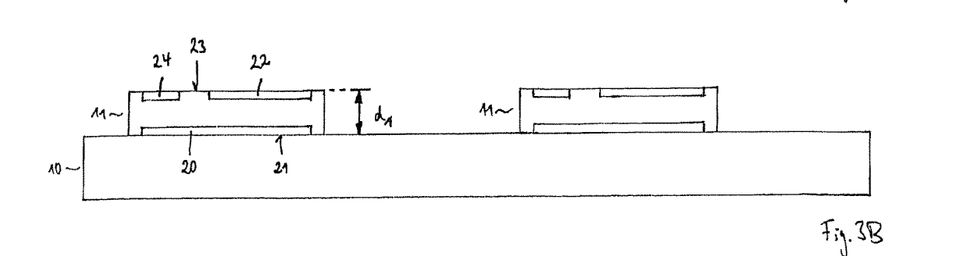
Figure 3C:
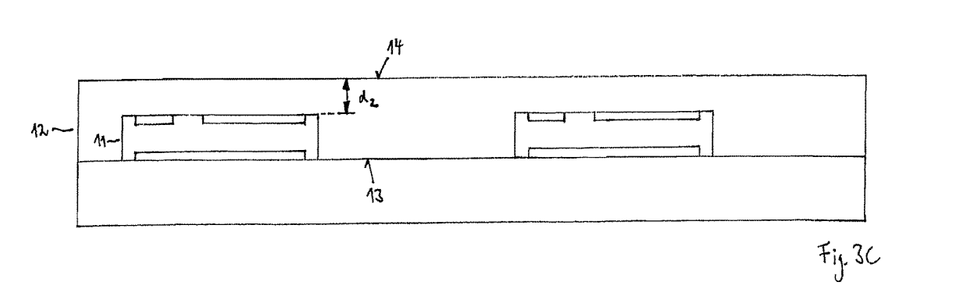
Figure 3D:
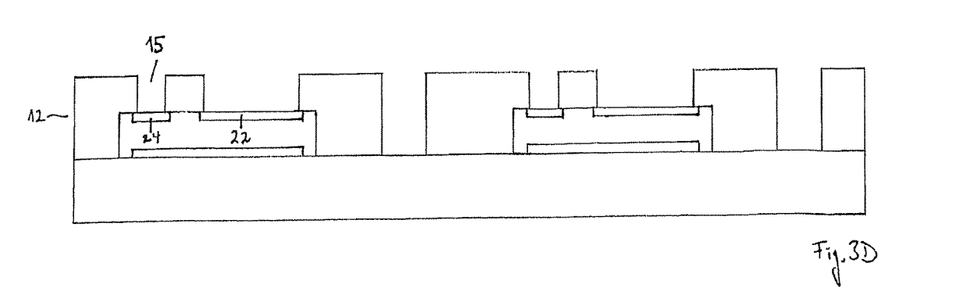
Figure 3E:
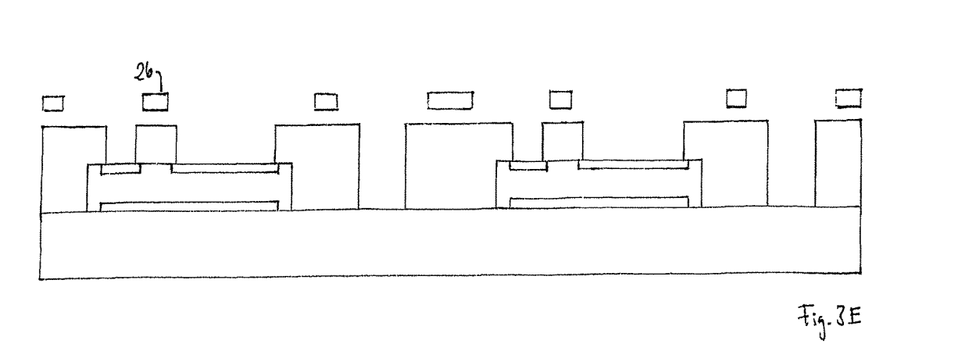
Figure 3F:
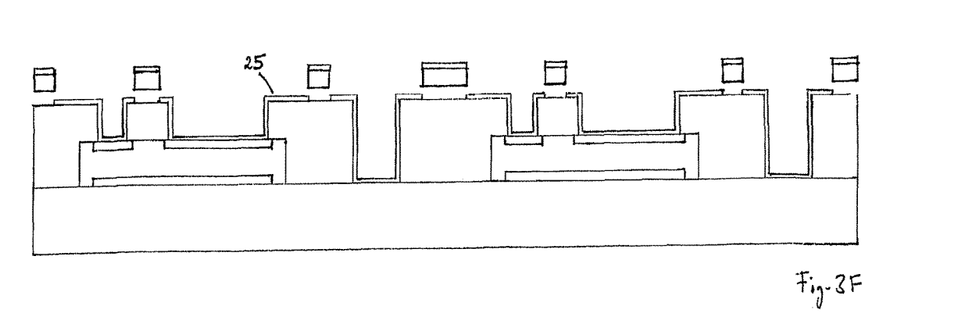
Figure 3G:
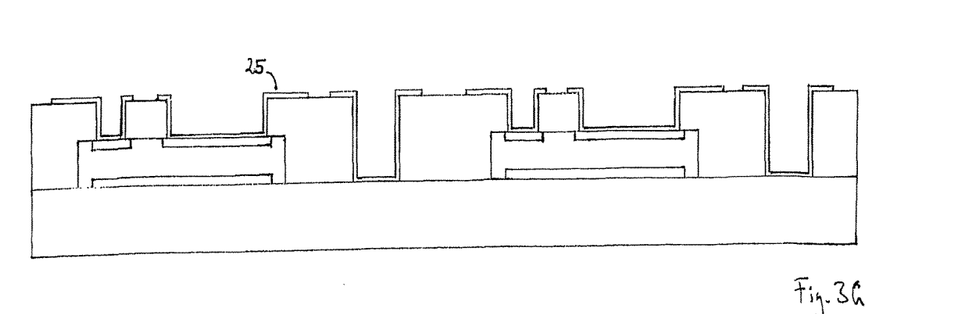
Figure 3H:
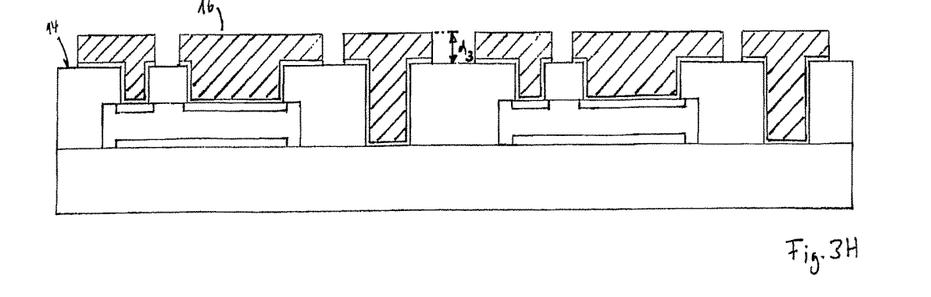
Figure 3I:
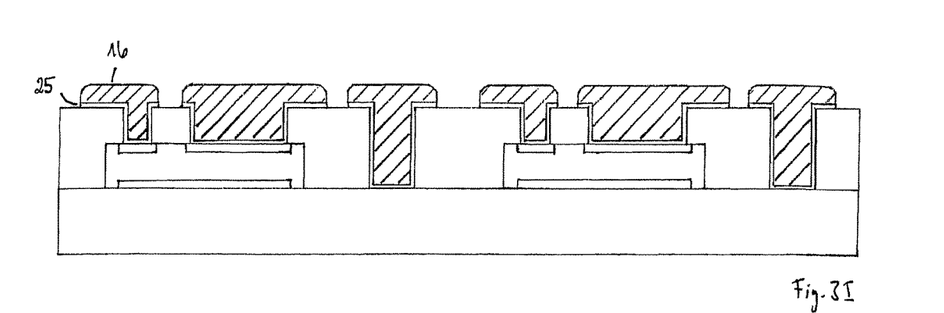
Figure 3J:
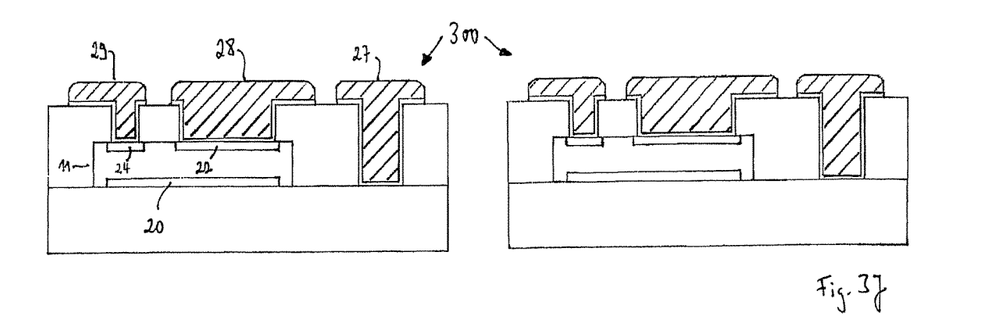
Figure 3K:
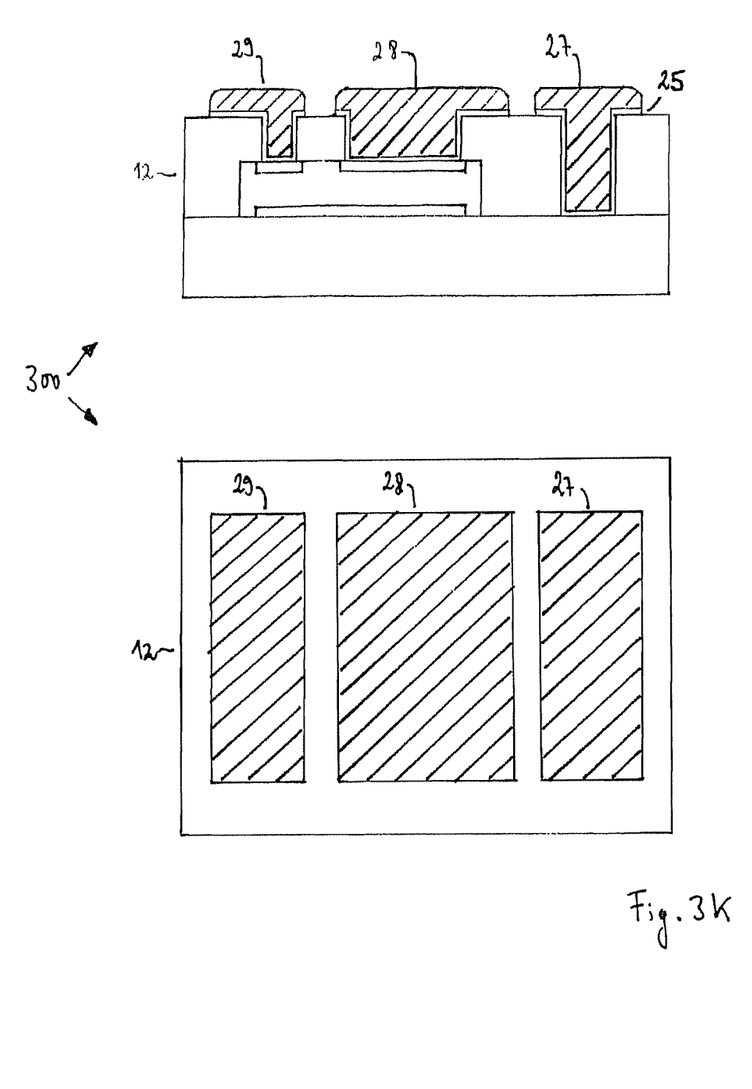

FIGS. 3A to 3K schematically illustrate a method for production of a device 300, a cross section (top) and top view (bottom) of which is illustrated in FIG. 3K. The device 300 is an implementation of the devices 100 and 200. Furthermore, the method illustrated in FIGS. 3A to 3K is a development of the method illustrated in FIGS. 2A to 2E. The details of the device 300 and the production method that are described below can therefore be likewise applied to the devices 100 and 200 and the method of FIGS. 2A to 2E, respectively.

As illustrated in FIG. 3A, electrically conductive carrier 10 is provided. In one embodiment, carrier 10 may be a plate or a foil made of a rigid material, for example, a metal or a metal alloy, such as copper, aluminum, iron nickel, CuFeP, steel or stainless steel. The carrier 10 may have a flat upper surface on which the components of the device 300 are placed later on. The shape of the carrier 10 is not limited to any geometric shape, and the carrier 10 may have any appropriate size. For example, the thickness of the carrier 10 may be in the range from 50 μm to 1 mm or may be even thicker. Furthermore, the carrier 10 may be structured. The carrier 10 may be, for example, a leadframe or a part of a leadframe. Moreover, the carrier 10 may be plated with an electrically conductive material, for example, copper, silver, iron nickel or nickel phosphorus.

As illustrated in FIG. 3B, two semiconductor chips 11 as well as typically a large number of further semiconductor chips 11 are mounted on the carrier 10, depending on the size of the carrier 10. The semiconductor chips 11 as well as all other semiconductor chips described herein may have been fabricated on a wafer made of semiconductor material. After dicing the wafer and thereby separating the individual semiconductor chips 11, the semiconductor chips 11 are relocated on the carrier 10 in larger spacings as they have been in the wafer bond. The semiconductor chips 11 may have been manufactured on the same wafer, but may in one embodiment have been manufactured on different wafers. Furthermore, the semiconductor chips 11 may be physically identical, but may also contain different integrated circuits. The thickness $d_1$ of the semiconductor chips 11 may be in the range from some hundred micrometer to 20 μm and in one embodiment in the range from 80 μm to 20 μm.

The semiconductor chips 11 may have a first electrode 20 on a first main face 21 and a second electrode 22 on a second main face 23 that is opposite to the first main face 21. The semiconductor chips 11 may be power semiconductor chips, for example, IGBTs, vertical power diodes or vertical power transistors, such as power MOSFETs. In the latter case, which is exemplarily illustrated in FIG. 3B, the first and second electrodes 20 and 22 may be drain and source electrodes (load electrodes), respectively. Furthermore, the semiconductor chips 11 may have a third electrode 24 on the second main face 23 functioning as a gate terminal (control electrode) in the case the semiconductor chips 11 are power MOSFETs. During operation, voltages of up to 5, 50, 100, 500 or 1000 V or even higher may be applied between the load electrodes 20 and 22. The switching frequency applied to the control electrode 24 may be in the range from 1 kHz to 1 MHz, but may also be outside this range.

The semiconductor chips 11 are mounted onto the carrier 10 with their first main faces 21 facing the planar top surface of the carrier 10. The drain electrodes 20 may be electrically connected to the electrically conductive carrier 10. The electrical connections between the drain electrodes 20 of the semiconductor chips 11 and the carrier 10 may, for example, be produced by reflow soldering, vacuum soldering, diffusion soldering or adhesive bonding by using an electrically conductive adhesive.

If diffusion soldering is used as a connecting technique, it is possible to use solder materials which lead to intermetallic phases after the end of the soldering operation at the interface between the carrier 10 and the respective semiconductor chip 11 on account of interface diffusion processes. In this case, the use of Sn, AuSn, AgSn, CuSn, AgIn, AuIn, CuIn, AuSi or Au solders is conceivable. If the semiconductor chips 11 are adhesively bonded to the carrier 10, it is possible to use electrically conductive adhesives which may be based on epoxy resins and be enriched with gold, silver, nickel or copper in order to produce the electrical conductivity.

The electrically insulating layer 12 is deposited on the semiconductor chips 11 and also covers the exposed parts of the carrier 10 (see FIG. 3C). The deposition of the electrically insulating layer 12 may, for example, be performed by stencil printing, screen printing or any other appropriate printing technique. In one embodiment, the electrically insulating layer 12 may be laminated as a foil or sheet onto the underlying structures by applying vacuum as well as heat and pressure for a suitable time. It may also be provided that an electrically insulating material is deposited from a solution or a gas phase and may be built-up in a layer-by-layer fashion to a desired thickness. Techniques that can be employed for this kind of deposition are, for example, physical or chemical vapor deposition, spinning, dispensing, dipping, injection molding or compression molding. The electrically insulating layer 12 may be fabricated from a polymer, such as parylene, a photoresist material, an epoxy resin, a silicone, a mold material or an inorganic, ceramic-like material, such as silicone-carbon compounds.

The height $d_2$ of the electrically insulating layer 12 above the second main faces 23 of the semiconductor chips 11 may be at least 10 μm and in one embodiment around 30 μm. After its deposition the electrically insulating layer 12 may provide a planar upper surface 14, which is coplanar to the upper surface of the carrier 10 and thus the lower surface 13 of the electrically insulating layer 12. The planar surface 14 may be used to attach other components of the device 300.

The electrically insulating layer 12 may be structured as illustrated in FIG. 3D. A plurality of cutouts or through-holes 15 are created in the electrically insulating layer 12 to expose at least portions of the source electrodes 22 and the gate electrodes 24 of the power transistors 11 as well as portions of the upper surface of the carrier 10 so that electrical connections can be made to those exposed regions.

If the electrically insulating layer 12 includes photo-active components, the electrically insulating layer 12 may be photo-lithographically structured. As an alternative the electrically insulating layer 12 may, for example, be structured by etching, laser ablation, stamping or any other suitable process known to a person skilled in the art.

As illustrated in FIGS. 3E to 3G, one or more metal layers 25 are deposited on the portions of the carrier 10 and the semiconductor chips 11 exposed by the through-holes 15 and portions of the second face 14 of the electrically insulating layer 12. The metal layers 25 may, for example, be sputtered. As illustrated in FIG. 3E, a shadow mask 26 may be introduced between the sputter source and the second face 14 of the electrically insulating layer 12 such that only the desired portions of the underlying structure are coated with the metal layers 25 (see FIG. 3F). As an alternative, the metal layers 15 may be deposited onto the entire second face 14 and afterwards the metal layers 25 are structured, for example, by etching.

As alternatives to sputtering, other deposition methods, such as physical vapor deposition, chemical vapor deposition, electrochemical deposition, spin-on processes, spray deposition or ink jet printing may be used for the deposition of the metal layers 25.

The metal layers 25 may function as a diffusion barrier which protects the semiconductor material of the semiconductor chips 11 from the solder material 16, which is to be deposited onto the metal layers 25, during the soldering process. Another function of the metal layers 25 may be that of an adhesion layer, which enables the solder material 16 to adhere to the underlying structure.

The metal layers 25 may, for example, consist of a titanium layer, a nickel layer deposited on the titanium layer and a silver layer deposited on the nickel layer. In this case, the titanium layer has the function of a diffusion barrier, and the nickel layer has the function of a solder joint layer, which is at least partially dissolved by the solder material 16 during the soldering process. The silver layer may prevent the nickel layer from oxidation. The titanium layer may have a thickness in the range from 50 to 300 nm, the nickel layer may have a thickness in the range from 100 to 500 nm, and the silver layer may have a thickness in the range from 200 to 500 nm. Other metals or metal alloys than titanium, nickel and silver may in one embodiment be used for the metal layers 25.

After the deposition of the metal layers 25, the through-holes 15 produced in the electrically insulating layer 12 may be filled with a solder material 16 in order to form through-connections in the electrically insulating layer 12 (see FIG. 3H). The solder material 16 may, for example, be AgSn, AuSn, CuSn, Sn, AgIn or CuIn. Furthermore, the second face 14 of the electrically insulating layer 12 may act as a platform for the deposition of the solder material 16 on top of the electrically insulating layer 12. During its deposition the solder material 16 may be a solder paste, which is, for example, deposited by stencil printing, screen printing or any other appropriate deposition technique. The height $d_3$ of the solder layer 16 above the second face 14 of the electrically insulating layer 12 may be in the range from 50 to 300 μm.

After its deposition the solder material 16 is heated, for example, in an oven or a hot plate, for an appropriate time. The applied temperature may be higher than the melting temperature of the solder material 16 and may, for example, be in the range from 250 to 350° C. In one embodiment, by liquefying the solder material 16 it is compressed as illustrated in FIG. 3I. In one embodiment, the temperature process causes the solder material 16 to adhere only at those places where the metal layers 25 are deposited. Thus, even if during the deposition portions of the solder material 16 are distributed at places where no underlying metal layers 25 are present, the temperature process ensures that the solder material 16 finally adheres only at the islands defined by the metal layers 25.

As illustrated in FIG. 3J, the two semiconductor chips 11 are separated from one another by separation of the carrier 10 and the electrically insulating layer 12, for example, by sawing, cutting, etching or laser ablation.

Each of the devices 300 illustrated in FIG. 3J has three external contact elements 27, 28 and 29, all of them are located at the same side of the device 300. The external contact elements 27 to 29 are solder islands and allow to electrically contact the semiconductor chip 11 from outside the device 300. The external contact element 27 is electrically coupled to the electrode 20 of the semiconductor chip 11 via the electrically conductive carrier 10. The external contact elements 28 and 29 are electrically coupled to the electrodes 22 and 24, respectively.

It may be provided that the devices 300 are not covered with mold material after the singulation of the devices. In one embodiment, a mold transfer process may be carried out to encapsulate the devices 300 with a mold material leaving the external contact elements 27 to 29 exposed (not illustrated).

In FIG. 3K the device 300 is illustrated in cross section (top) and top view (bottom). The top view of the device 300 illustrates the geometries and arrangements of the external contact elements 27 to 29. It is to be noted that FIG. 3K illustrates only an example of how the external contact elements 27 to 29 may be shaped and arranged. It may be provided that the external contact elements 27 to 29 are shaped and arranged in any other way. The surface areas of the external contact elements 27 to 29 may be larger than the surface areas of the corresponding electrodes 20, 22 and 24. Furthermore, their shapes may be different. In other words, the side of the device 300 where the external contact elements 27 to 29 are located may have any desired footprint for external connections. This way, footprint geometry and chip contact geometry are decoupled from each other. Furthermore, it is to be noted that the external contact elements 28 and 29, which are electrically coupled to the electrodes 22 and 24, may extend beyond the semiconductor chip 11 and may be arranged at least partially outside of a region defined by the contour of the semiconductor chip 11.

The exposed surfaces of the external contact elements 27 to 29 may be used to electrically couple the device 300 to other components. This is exemplarily illustrated in FIG. 4. There, an excerpt of a device 400 is schematically illustrated which includes the device 300 that is mounted onto a circuit board 30, for example, a PCB (Printed Circuit Board). The solder deposits of the external contact elements 27 to 29 may have been soldered to contact pads 31 to 33, respectively, of the circuit board 30.

Figure 4:
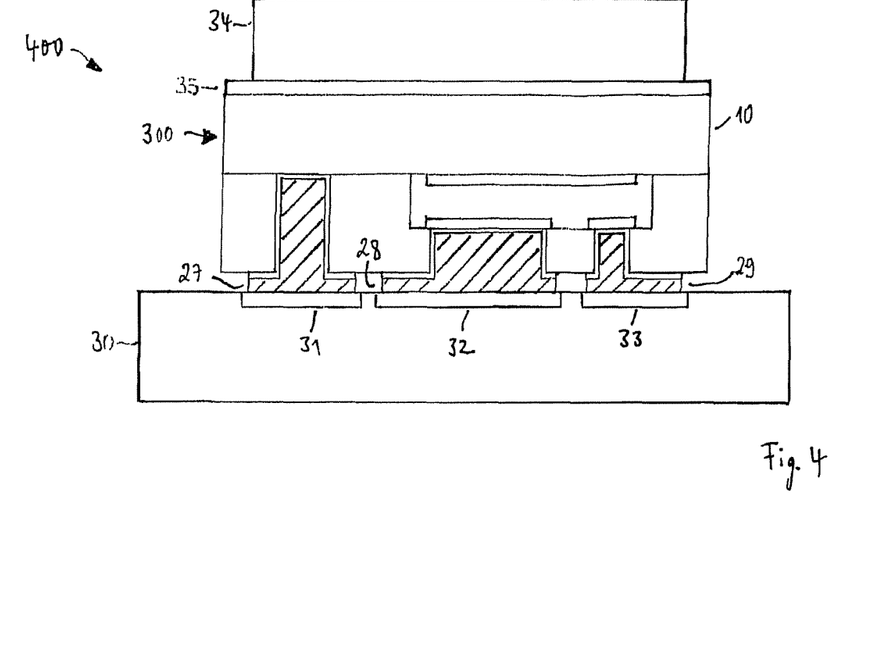
FIG. 4 schematically illustrates one embodiment of a device.

On top of the device 300, a heat sink or cooling element 34 may be attached. The heat sink or cooling element 34 may be electrically insulated from the carrier 10 by an electrically insulating layer 35. In one embodiment, the electrically insulating layer 35 may also be omitted in case the voltages applied to the carrier 10 are rather low. During operation, the thermal conductivity of the carrier 10 allows to transfer the heat generated by the semiconductor chip 11 to the heat sink or the cooling element 34 where the heat is dissipated. Furthermore, the heat generated by the semiconductor chip 11 can also partially be transferred to the circuit board 30 where it is dissipated.

It is obvious to a person skilled in the art that the devices 100, 200 and 300 illustrated in FIGS. 1, 2E and 3K are only intended to be exemplary embodiments, and many variations are possible. For example, the devices may include more than one semiconductor chip or passive components. The semiconductor chips and passive components may differ in function, size, manufacturing technology etc.

Figure 5:
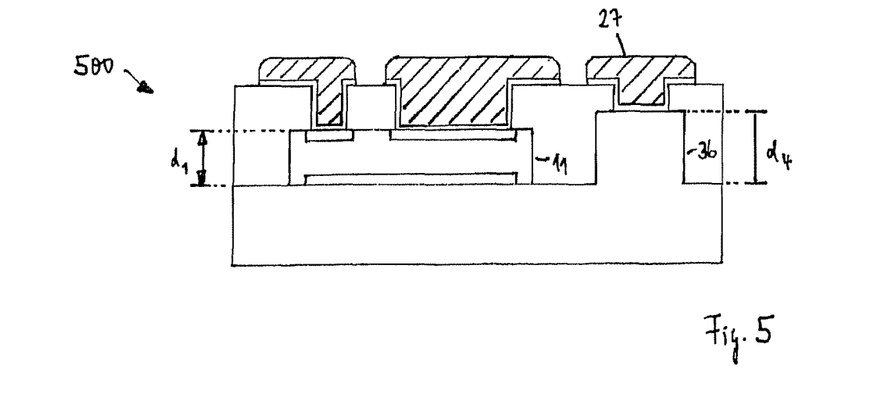
FIG. 5 schematically illustrates one embodiment of a device.

A further variation of the device 300 is illustrated in FIG. 5. There, a device 500 is illustrated the carrier 10 of which is not entirely flat, but has a protruding element 36. The protruding element 36 protrudes from the upper surface of the carrier 10 and may extend in a direction orthogonal to the upper surface of the carrier 10. The protruding element 36 may be integral with the carrier 10 and may have been manufactured by milling, bending, etching or any other appropriate technique. The through-connection forming the connection to the external contact element 27 may have been produced on top of the protruding element 36. The protruding element 36 may have a height $d_4$, which may be equal to the height $d_1$ of the semiconductor chip 11. In one embodiment, the height $d_4$ may be in the range ±5%, ±10% or ±20% of the height $d_1$. The device 500 may illustrate the same features as discussed above in connection with the device 300.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A method, comprising:
providing an electrically conductive carrier comprising a leadframe;
placing a semiconductor chip over the carrier, the semiconductor chip having a first electrode on a first face facing the carrier;
applying an electrically insulating layer over the carrier and the semiconductor chip, the electrically insulating layer having a first face facing the carrier and a second face opposite to the first face;
selectively removing the electrically insulating layer; and
applying solder material to places where the electrically insulating layer is removed and on the second face of the electrically insulating layer such that the solder material completely fills the places where the electrically insulating layer is removed and is on the second face of the electrically insulating layer on a first side and a second side opposite to the first side of each of the places where the electrically insulating layer is removed and extends from the first side to the second side over each of the places where the electrically insulating layer is removed to provide an external contact element having a surface area larger than a surface area of the first electrode, wherein a first sidewall of the electrically insulating layer is coplanar with a sidewall of the carrier and a second sidewall of the electrically insulating layer directly contacts the semiconductor chip, the second sidewall directly opposite to the first sidewall, and wherein the first sidewall and the second sidewall of the electrically insulating layer and the sidewall of the carrier are perpendicular to the first face.

2. The method of claim 1, comprising soldering the semiconductor chip to the carrier.

3. The method of claim 1, comprising selectively removing the electrically insulating layer by at least one of etching, photostructuring and laser structuring.

4. The method of claim 1, comprising heating the solder material.

5. The method of claim 1, comprising applying at least one metal layer to the carrier, the semiconductor chip, and the electrically insulating layer after selectively removing the electrically insulating layer.

6. The method of claim 5, comprising applying the solder material to the at least one metal layer.

7. The method of claim 5, comprising applying the at least one metal layer by sputtering.

8. The method of claim 1, comprising exposing portions of the carrier and the semiconductor chip after selectively removing the electrically insulating layer.

9. The method of claim 1, wherein the semiconductor chip has a second electrode on a second face opposite to the first face.

10. A method, comprising:
providing an electrically conductive carrier comprising a leadframe;
placing a semiconductor chip over a face of the carrier, the semiconductor chip having a first electrode on a first face facing the carrier;
applying an electrically insulating layer over the carrier and the semiconductor chip;
forming a first through-hole in the electrically insulating layer;
applying at least one metal layer to the electrically insulating layer adjacent to the first through-hole;
depositing solder material in the first through-hole and on the at least one metal layer such that the solder material completely fills the first through-hole and is on the metal layer adjacent a first side and adjacent a second side opposite to the first side of the first through-hole and extends from the first side to the second side over the first through-hole; and
heating the solder material to provide an external contact element having a surface area larger than a surface area of the first electrode, wherein a first sidewall of the electrically insulating layer is coplanar with a sidewall of the carrier and a second sidewall of the electrically insulating layer directly contacts the semiconductor chip, the second sidewall directly opposite to the first sidewall, and wherein the first sidewall and the second sidewall of the electrically insulating layer and the sidewall of the carrier are perpendicular to the face of the carrier.

11. The method of claim 10, comprising soldering the semiconductor chip to the carrier.

12. The method of claim 10, comprising forming the first through-hole by at least one of etching, photostructuring and laser structuring.

13. The method of claim 10, comprising applying the at least one metal layer by sputtering.

14. The method of claim 10, wherein the semiconductor chip has a second electrode on a second face opposite to the first face.

15. The method of claim 10, wherein the first through-hole extends to the carrier.

16. The method of claim 10, wherein the carrier comprises a protruding element.

17. The method of claim 16, wherein the first through-hole extends to the protruding element.

18. The method of claim 1, comprising applying an adhesion metal layer and a diffusion barrier metal layer to the carrier, the semiconductor chip, and the electrically insulating layer after selectively removing the electrically insulating layer.

19. The method of claim 10, wherein applying the at least one metal layer comprises applying a first metal layer, a second metal layer, and a third metal layer.

20. The method of claim 19, wherein the first metal layer comprise a titanium layer, the second metal layer comprises a nickel layer on the titanium layer, and the third metal layer comprises a silver layer on the nickel layer.

* * * * *